US008377828B2

(12) United States Patent
Matsumoto et al.

(10) Patent No.: US 8,377,828 B2
(45) Date of Patent: Feb. 19, 2013

(54) METHOD OF MANUFACTURING A SUBSTRATE FOR A LIQUID DISCHARGE HEAD

(75) Inventors: Keiji Matsumoto, Yokohama (JP); Shuji Koyama, Kawasaki (JP); Hiroyuki Abo, Tokyo (JP); Keiji Watanabe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/709,544

(22) Filed: Feb. 22, 2010

(65) Prior Publication Data

US 2010/0216264 A1 Aug. 26, 2010

(30) Foreign Application Priority Data

Feb. 26, 2009 (JP) ................................ 2009-044111
Dec. 16, 2009 (JP) ................................ 2009-285779

(51) Int. Cl.
*H01L 21/302* (2006.01)
(52) U.S. Cl. ...................................................... 438/733
(58) Field of Classification Search .................. 438/401, 438/733
See application file for complete search history.

(56) References Cited

U.S. PATENT DOCUMENTS

| | | | | |
|---|---|---|---|---|
| 6,720,522 | B2 * | 4/2004 | Ikegami et al. | 219/121.69 |
| 6,890,391 | B2 * | 5/2005 | Aoki et al. | 134/32 |
| 2004/0238485 | A1 | 12/2004 | Hayakawa et al. | |
| 2005/0070068 | A1 * | 3/2005 | Kobayashi | 438/401 |
| 2007/0212890 | A1 | 9/2007 | Sakai et al. | |
| 2007/0212891 | A1 * | 9/2007 | Yamamuro et al. | 438/733 |
| 2007/0279456 | A1 | 12/2007 | Shimada | |

FOREIGN PATENT DOCUMENTS

| | | | |
|---|---|---|---|
| EP | 1 378 363 | A2 | 1/2004 |
| EP | 1 378 363 | A3 | 1/2004 |

OTHER PUBLICATIONS

Chinese Office Action issued in corresponding Application No. 201010122999.9 dated Jun. 9, 2011; 13 pages; and English translation thereof.

* cited by examiner

*Primary Examiner* — Charles Garber
*Assistant Examiner* — Andre' C Stevenson
(74) *Attorney, Agent, or Firm* — Fitzpatrick, Cella, Harper & Scinto

(57) ABSTRACT

A method of manufacturing a substrate for a liquid discharge head, the substrate being a silicon substrate having a first surface opposed to a second surface, the method comprising the steps of providing a layer on the second surface of the silicon substrate, wherein the layer has a lower etch rate than silicon when exposed to an etchant of silicon, partially removing the layer so as to expose part of the second surface of the silicon substrate, wherein the exposed part surrounds at least one part of the layer; and wet etching the layer and the exposed part of the second surface of the silicon substrate, using the etchant of silicon, to form a liquid supply port extending from the second surface to the first surface of the silicon substrate.

9 Claims, 8 Drawing Sheets

METHOD OF MANUFACTURING A SUBSTRATE FOR A LIQUID DISCHARGE HEAD

BACKGROUND OF THE INVENTION

1. Field of the Invention

The present invention relates to a manufacturing method of a liquid discharge head substrate (a substrate for a liquid discharge head), and in particular relates to a manufacturing method of substrate for an ink jet recording head for use in an ink jet recording head that discharges ink onto a recording medium to perform recording.

2. Description of the Related Art

One application example of a liquid discharge head is an ink jet recording head that discharges ink as liquid droplets onto a recording medium (typically, paper) by energy to perform recording. For the ink jet recording head, there is a known technique in which energy generating elements that are mounted on a surface of a substrate are supplied with ink from an opposite surface of the substrate via a supply port passing from the opposite surface through to the surface. A manufacturing method of a substrate for this type of ink jet recording head is disclosed in U.S. Patent Application No. 2007/0212890.

In the manufacturing method described in U.S. Patent Application No. 2007/0212890, an opening is formed in an etching mask layer on an opposite surface of a silicon substrate, a depression is formed in silicon exposed in the opening by dry etching, a laser, or the like, and the silicon substrate is wet etched from the depression to form a supply port that passes through the substrate.

However, in the method described in U.S. Patent Application No. 2007/0212890, the opening is formed in an entire area of the opposite surface of the substrate corresponding to the supply port, which requires patterning to be performed on the etching mask layer. A photolithography process is necessary for this operation.

SUMMARY OF THE INVENTION

In view of the above, the present invention has an advantage of providing a method of manufacturing a substrate for a liquid discharge head according to which an ink supply port can be formed simply and in a relatively short time.

The present invention provides a method of manufacturing a substrate for a liquid discharging head, the substrate being a silicon substrate having a first surface and a second surface, the method providing the steps of: providing a layer on the second surface of the silicon substrate, wherein the layer has a lower etching rate than silicon when exposed to an etchant of silicon; partially removing the layer so as to expose a part of the second surface of the silicon substrate wherein the exposed part surrounds at least one part of the layer; and wet etching the layer and the exposed part of the second surface of the silicon substrate, using the etchant of silicon, to form a liquid supply port extending from the second surface to the first surface of the silicon substrate.

According to the present invention, an ink supply port can be formed in a relatively short time.

Further features of the present invention will become apparent from the following description of exemplary embodiments with reference to the attached drawings.

DESCRIPTION OF THE EMBODIMENTS

Figure 1:
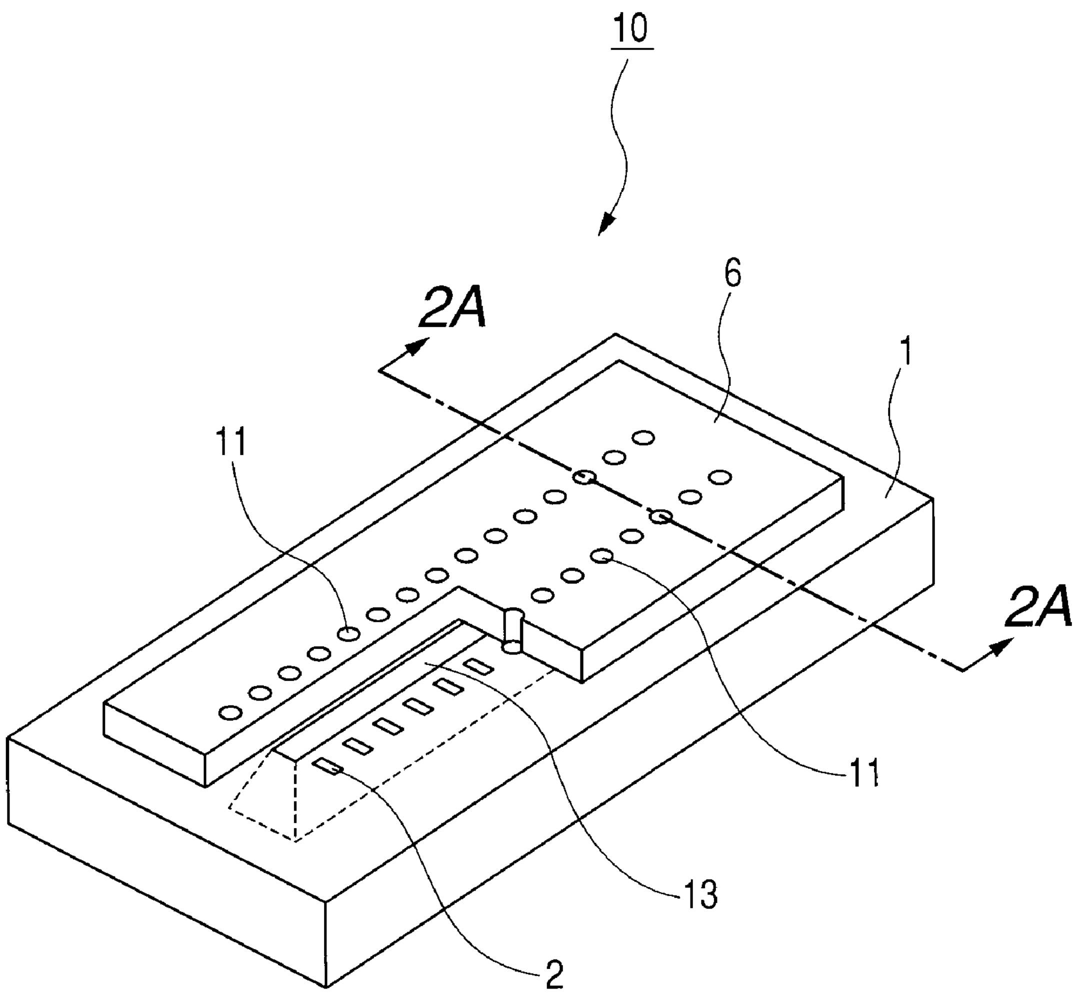
FIG. 1 is a perspective view illustrating a structure of an ink jet recording head according to a first embodiment.

Preferred embodiments of the present invention will now be described in detail in accordance with the accompanying drawings.

The following describes embodiments of the present invention with reference to drawings. In the following description, an ink jet recording head is used as an example of a liquid discharge head, and an ink jet recording head substrate is used as an example of a liquid discharge head substrate. However, the present invention is not limited to such. The liquid discharge head is applicable not only in printing fields but also in various industrial fields such as circuit formation, and the liquid discharge head substrate is usable as a substrate installed in such a liquid discharge head.

In the following description, corresponding features may be designated by the same numeral in the drawings and their description omitted.

First Embodiment

FIG. 1 is a perspective view illustrating an ink jet recording head according to a first embodiment of the present invention. An ink jet recording head 10 illustrated in FIG. 1 includes a silicon substrate 1 on which energy generating elements 2 for generating energy used to discharge a liquid such as ink are arranged at a predetermined pitch in two rows. A polyether amide layer (not illustrated) is formed on the silicon substrate 1 as an adhesion layer. Moreover, an organic film layer 6 that includes a flow path side wall and ink discharge ports 11 located above the energy generating elements 2 is formed on the silicon substrate 1. In addition, an ink supply port 13 is formed in the silicon substrate 1 between the rows of the energy generating elements 2. Furthermore, an ink flow path communicating from the ink supply port 13 to each ink discharge port 11 is formed.

The ink jet recording head 10 is positioned so that its surface on which the ink discharge ports 11 are formed faces a recording surface of a recording medium. When the energy generating elements 2 apply pressure to ink (liquid) that is filled in the ink flow path from the ink supply port 13, droplets of ink are discharged from the ink discharge ports 11. These droplets of ink are deposited on the recording medium, as a result of which an image is formed. Note that the term "to form an image" includes not only an instance of forming an image having some meaning such as characters, figures, and signs, but also an instance of forming an image having no specific meaning such as geometrical patterns.

In a manufacturing method according to an embodiment of the present invention, an etching mask layer is processed by a laser, dry etching, or the like to create a frame pattern for forming an opening of the ink supply port, and then crystal anisotropic etching is performed.

Figure 2A:
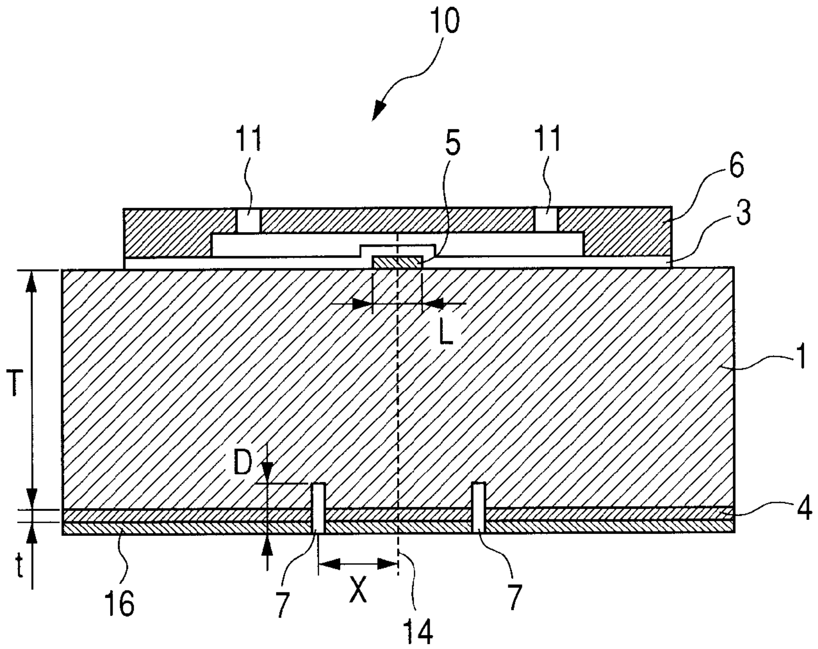
FIGS. 2A and 2B are views for describing a manufacturing method of the ink jet recording head according to the first embodiment.
Figure 2B:
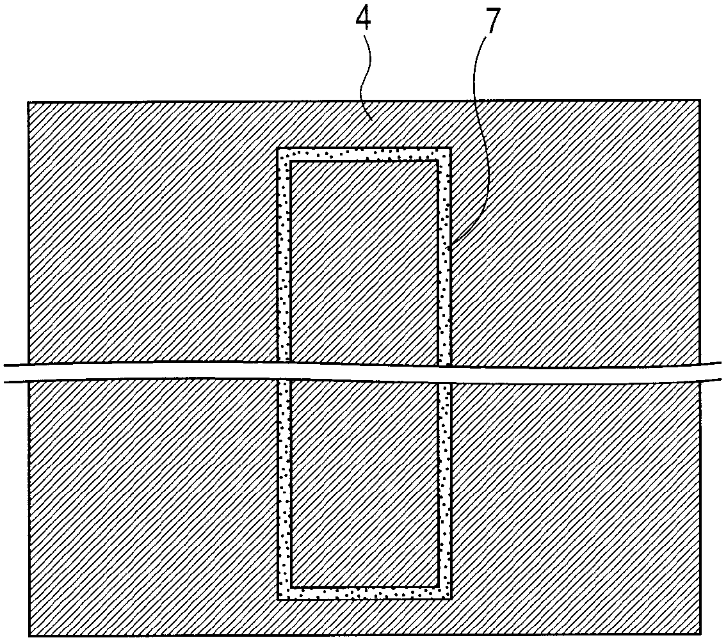
Figure 3A:
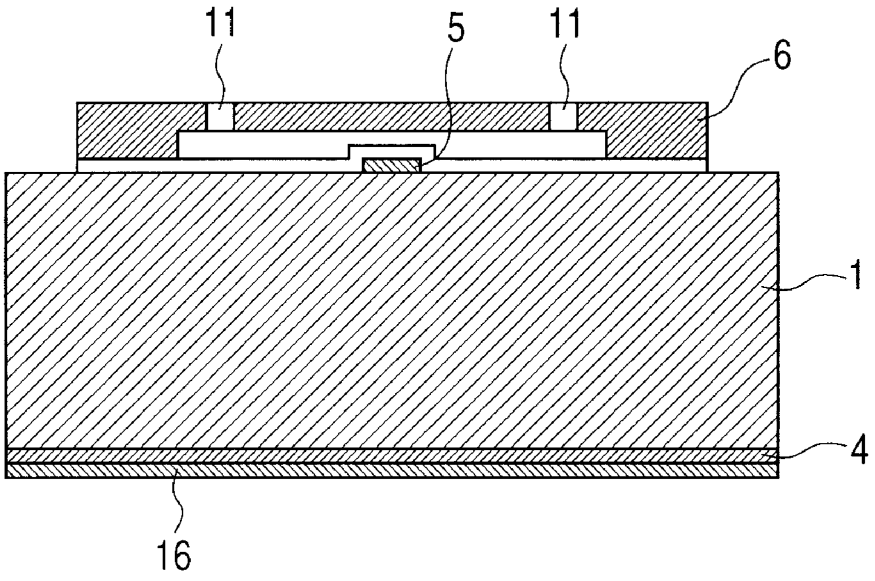
FIGS. 3A and 3B are views for describing the manufacturing method of the ink jet recording head according to the first embodiment.
Figure 3B:
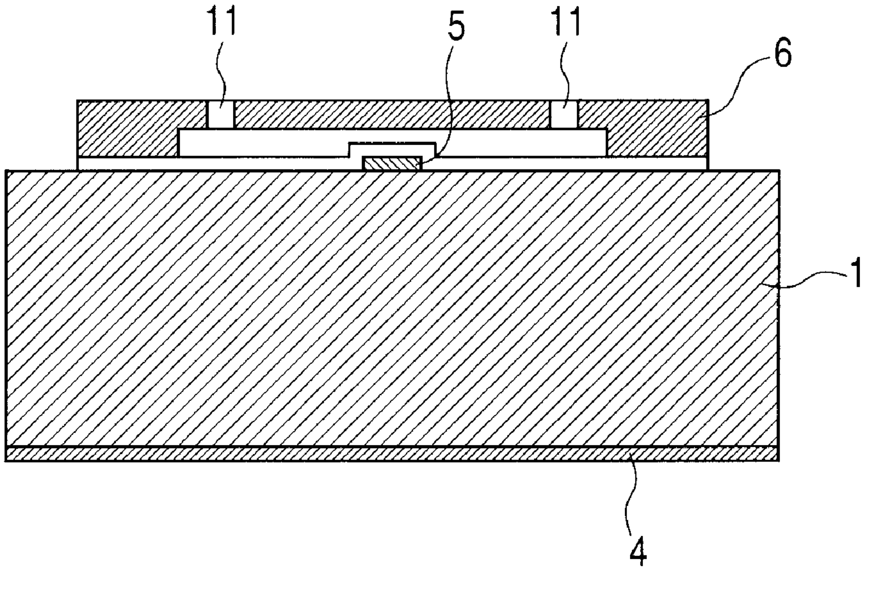
Figure 4A:
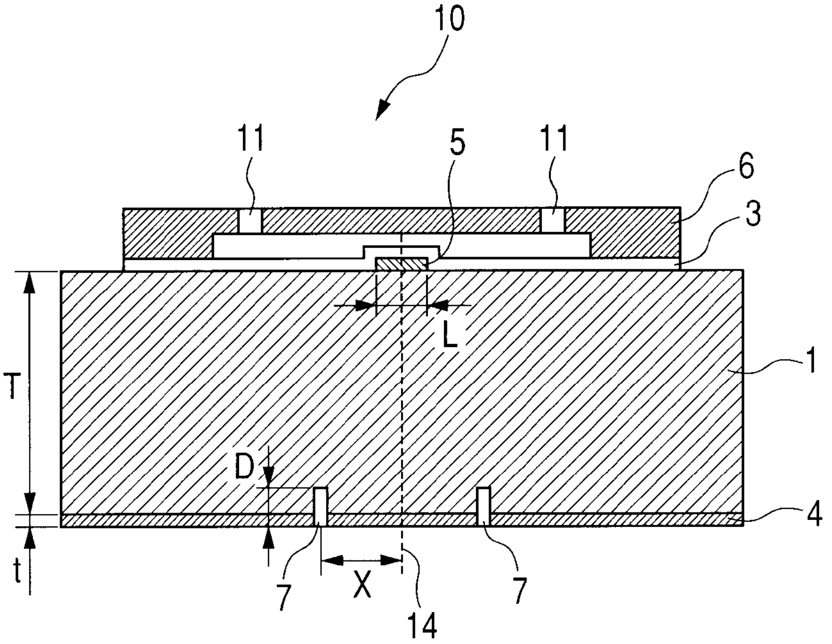
FIGS. 4A and 4B are views illustrating a state during a manufacturing process in the manufacturing method of the ink jet recording head according to the first embodiment.
Figure 4B:
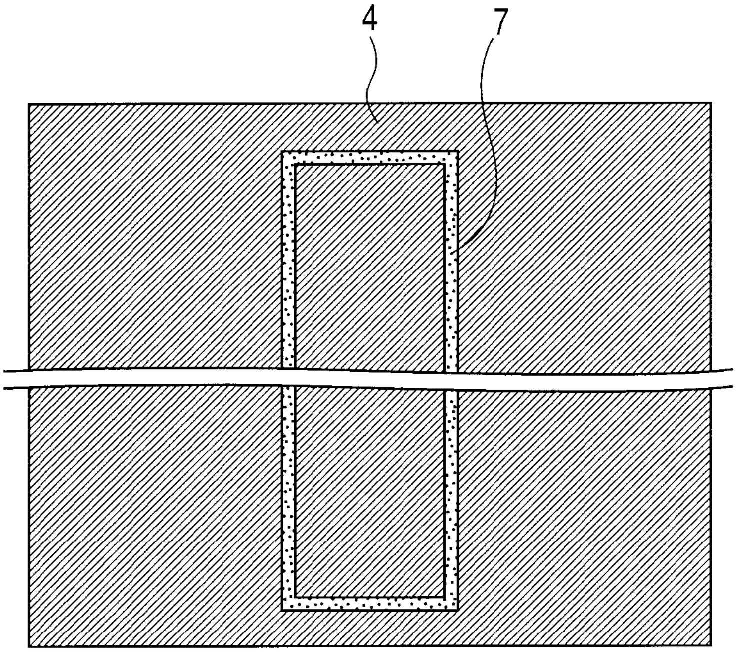

FIGS. 3A and 3B are sectional views for describing the manufacturing method of the ink jet recording head 10, taken along the section line 2A-2A in FIG. 1. FIG. 2A is a sectional view taken along the section line 2A-2A in FIG. 1 and FIG. 2B is a plan view of an opposite surface (second surface) of the silicon substrate 1. Note that FIG. 2A illustrates a state before the ink supply port 13 is formed. FIG. 4A is a sectional view taken along the section line 2A-2A in FIG. 1, and FIG. 4B is a plan view of the opposite surface (second surface) of the silicon substrate 1. FIGS. 2A, 2B, 4A, and 4B illustrate a state before the ink supply port 13 is formed.

As illustrated in FIG. 3A, the silicon substrate having the organic film layer 6 as a discharge port member provided with the discharge ports 11 is prepared. The energy generating elements 2 are arranged in two rows along a longitudinal direction of the silicon substrate 1, on the surface of the silicon substrate 1. The energy generating elements 2 are composed of wiring made of Al or the like, a high-resistance material such as TaSiN or TaN, and so on. Moreover, a sacrificial layer 5 for specifying an opening width of the ink supply port 13 on the surface side can be formed on the surface of the silicon substrate 1. The use of Al as a material of the sacrificial layer 5 is efficient because the sacrificial layer 5 can be formed at the same time as wiring. After forming the sacrificial layer 5, an insulating protective film 3 is formed so as to cover the energy generating elements 2 and the sacrificial layer 5. The insulating protective film 3 is made of SiO, SiN, or the like. The insulating protective film 3 protects the wiring formed on the silicon substrate 1 from ink and other liquids, and also serves as an etching stop layer when forming the ink supply port 13. The adhesion layer (not illustrated) and the organic film layer 6 are provided on the insulating protective film 3 using a photolithography process, thereby forming the ink flow path and the ink discharge ports 11. The silicon substrate 1 also has an etching mask layer 4 on its opposite surface. An etching rate of the etching mask layer 4 to an etchant of silicon is lower than an etching rate of silicon to the etchant. The etching mask layer 4 can be sufficiently resistant to the etchant of silicon, and at least one layer of the etching mask layer 4 is formed on the opposite surface of the silicon substrate 1. For example, an insulating film such as SiO, a metal film such as Mo, Au, TiN, or Ti, an inorganic film, and an organic film are formed as the etching mask layer 4. The use of a thermal oxide film of SiO contributes to a shorter manufacturing time, since it can be formed at the same time as the insulating protective film 3 on the surface.

In the case where dust or the like is present on the opposite surface of the silicon substrate 1 in the operation of forming the mask layer 4, such dust can cause a small defect in the mask layer 4. In view of this, a protective film 16 that, even when a pinhole (not illustrated) is present, can cover such a pinhole may be formed. In the formation of the protective film 16, selection can be made from films such as an organic film and an inorganic film. In terms of adhesiveness to Si, however, a silicon-based film such as SiO, $SiO_2$, SiN, or SiC is suitable. A formation method may be a well known method such as spin coating or sputtering. In this embodiment, a $SiO_2$ film is formed on the etching mask layer 4 by firing using polysilazane as the protective film 16 of a TMAH (tetramethyl ammonium hydroxide) etchant, which is applicable to the present invention. Polysilazane forms a $SiO_2$ film by reacting with water in air, as shown by Formula 1.

$$—(SiH_2NH)—+2H_2O \rightarrow SiO_2+NH_3+2H_2 \quad \text{(Formula 1).}$$

An etching resistance increases when a firing temperature is higher. In consideration of an etching time, firing at 250° C. or higher is suitable.

Alternatively, a structure of not providing the protecting film 16 may be adopted as illustrated in FIG. 3B.

Next, a groove 7 having a rectangular frame shape as illustrated in FIG. 2B is formed in a portion of the etching mask layer 4 corresponding to the ink supply port 13, by removing the protective layer 16 and the etching mask layer 4 with a laser. One such frame corresponds to one supply port 13. Silicon exposed in a frame shape as a result of removing the protective layer 16 and the etching mask layer 4 encloses the protective layer 16 and the etching mask layer 4 in the inside of the frame. In this embodiment, laser processing is performed from over the protective film 16. In the laser processing operation, a third harmonic wave (a wavelength of 355 nm) of a YAG laser with excellent absorptivity to silicon is used as a laser source, and the groove 7 is formed under conditions of an output of about 4.5 W and a frequency of about 30 kHz. The groove 7 in a frame shape is formed so as to pass through the etching mask layer 4 and has a depth of about 10 μm from the opposite surface of the silicon substrate 1.

In the case of not providing the protective film 16 as illustrated in FIG. 3B, on the other hand, the groove 7 is provided in the silicon substrate 1 so as to pass through only the mask layer 4, as illustrated in FIG. 4A.

Each dimension illustrated in FIGS. 2A and 4A is defined as follows.

t denotes a thickness of the etching mask layer 4, and T denotes a thickness of the silicon substrate 1. X denotes a lateral distance from a longitudinal center line 14 of the silicon substrate 1 to a center of the groove 7 (so not the center of the frame itself). L denotes a width of the sacrificial layer 5, which is a width of an opening of the ink supply port 13 on the surface of the silicon substrate 1 in a lateral direction of the silicon substrate 1. D denotes a depth of the groove 7 toward the substrate.

The thickness T of the silicon substrate 1 is about 600 μm to 750 μm, and the depth of the groove 7 is about 5 μm to 20 μm. Instead of forming the groove 7 in the silicon substrate 1, silicon may be exposed by only removing the mask layer 4 in a frame shape by a laser. So long as silicon is exposed, etching from the opposite surface to the surface can be performed using a silicon etchant.

Figure 5A:
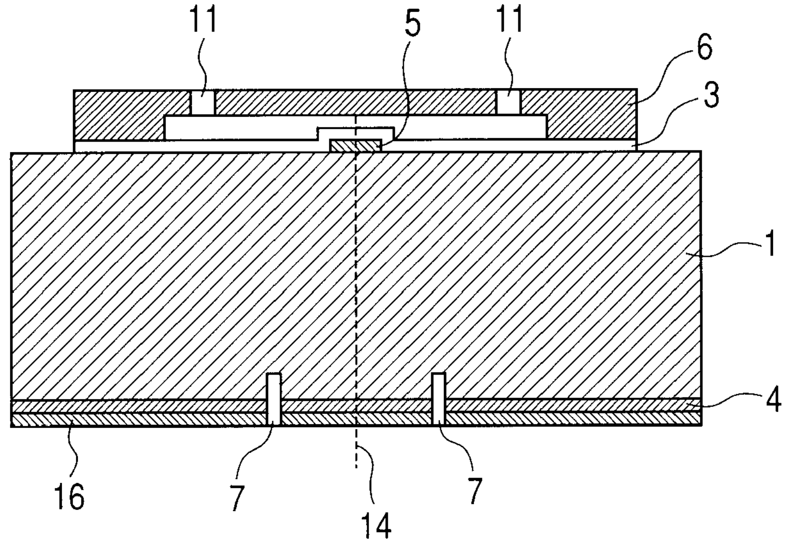
FIGS. 5A and 5B are views for describing a state during the manufacturing process in the manufacturing method of the ink jet recording head according to the first embodiment.
Figure 5B:
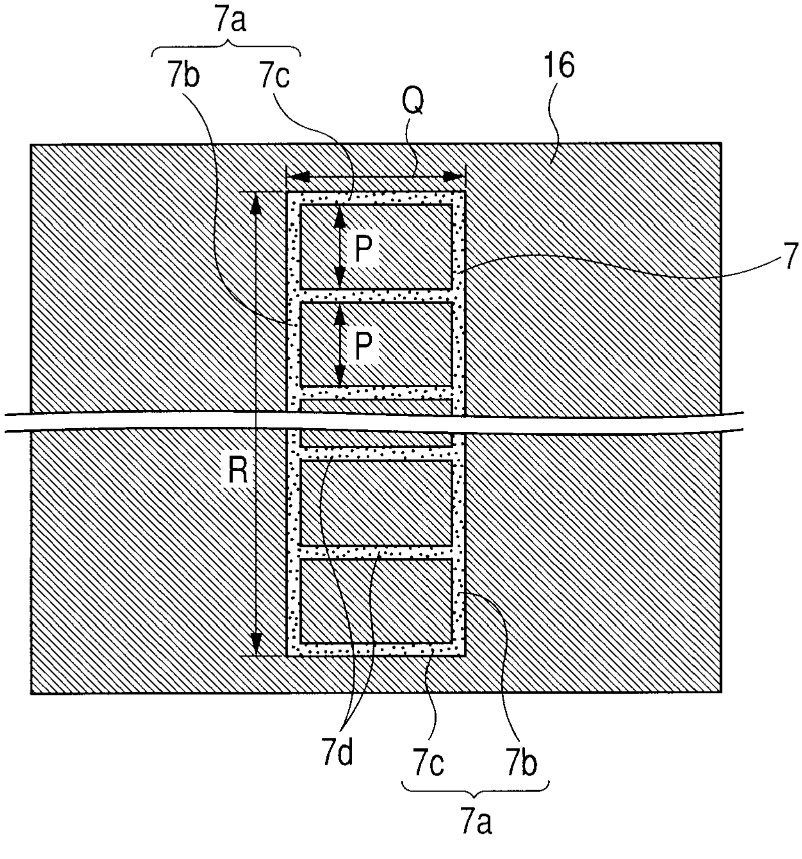

FIGS. 5A and 5B are views illustrating another pattern of the groove 7. FIG. 5A is a sectional view taken along the section line 2A-2A in FIG. 1, and FIG. 5B is a plan view of the opposite surface of the silicon substrate 1 covered with the etching mask layer 4. The groove 7 may be formed not in a frame shape as illustrated in FIG. 2B, but in a lattice (or ladder) shape as illustrated in FIG. 5B. Opposing side portions 7*d* of the groove 7 are situated inside outermost frame portions 7*a* (which form a rectangle), thereby forming a lattice shape. Of the outermost frame portions 7*a*, lateral portions 7*c* (whose length is denoted by Q) that are connected with longitudinal portions 7*b* (whose length is denoted by R) extending in the longitudinal direction of the substrate 1 are approximately parallel to the opposing side portions 7*d*, and the opposing side portions 7*d* are connected with the longitudinal portions 7*b* as with the lateral portions 7*c*.

In the case where the groove 7 is formed in a lattice shape, a laser processing time and an etching rate in an etching operation described later vary according to a pitch P of the groove 7 in the longitudinal direction of the silicon substrate 1 illustrated in FIG. 5B (so vary according to the distance between lateral portions of the groove).

Table 1 indicates relationships of the etching rate and the laser processing time with respect to the pitch P of the groove 7 in the longitudinal direction of the silicon substrate 1, in the case of adopting the shape of the groove 7 illustrated in FIGS. 5A and 5B in the manufacturing method of this embodiment. Here, R=15200 μm, and Q=700 μm.

TABLE 1

| | Pitch P (μm) | | | | |
|---|---|---|---|---|---|
| | 200 | 300 | 600 | 800 | 1000 |
| Etching rate | A | A | A | A | B |
| Laser processing time | B | B | A | A | A |

In Table 1, the etching rate is designated as A when a {100} surface which is one of the surface orientations of silicon can be formed in 10 hours in the etching operation described later. The etching rate is designated as B when, though the {100} surface cannot be formed in 10 hours in the etching operation, the {100} surface can be formed when etching proceeds to the sacrificial layer 5. Meanwhile, the laser processing time is designated as A when the time required for forming the groove 7 is not longer than (so less than or equal to) twice the time of forming the frame-shaped groove 7 illustrated in FIG. 2B, and designated as B when the time required for forming the groove 7 is longer than twice the time of forming the frame-shaped groove 7. As indicated in Table 1, when the pitch P is smaller, the laser processing time is longer but the etching time is shorter.

Accordingly, for a same level of etching rate as conventional, the pitch P can be set to not more than 800 μm. Furthermore, the pitch P is preferably set to 600 μm to 800 μm, when also taking the laser processing time into consideration.

In the case of forming the groove 7 in a lattice shape, the groove 7 is not limited to the shape partitioned in the longitudinal direction of the silicon substrate 1 as illustrated in FIG. 5B, and may have a shape partitioned in the lateral direction. Moreover, in the laser processing operation, the depth D of the groove 7 preferably satisfies the following relational expression (1) (see FIG. 2A).

$$t \leqq D \leqq T-(X-L/2)\tan 54.7° \quad (1).$$

In the above-mentioned expression (1), t denotes the thickness of the etching mask layer 4, and T denotes the thickness of the silicon substrate 1. X denotes the distance from the longitudinal center line 14 of the silicon substrate 1 to the center of the groove 7 formed along the center line 14. L denotes the width of the sacrificial layer 5 in the lateral direction of the silicon substrate 1.

When the above-mentioned expression is satisfied, an etched area is contained within the area of the sacrificial layer 5, so that the opening width of the opening of the ink supply port 13 on the surface of the silicon substrate 1 can be set to the width L of the sacrificial layer 5. There is the case where the width L of the sacrificial layer 5 is sufficiently large and (X−L/2) becomes a negative value. In such a case, the etched area reaches into the sacrificial layer 5 regardless of the values of T and t. Hence, the expression (1) is satisfied even in this case.

After the laser processing operation ends, the etching operation of forming the ink supply port 13 by passing through the silicon substrate 1 from the groove 7 to the sacrificial layer 5 by crystal anisotropic etching is performed. In the etching operation, TMAH (tetramethyl ammonium hydroxide) is used as an etchant. An internal state of the silicon substrate 1 in the etching operation is described below, with reference to FIGS. 6A to 6F. FIGS. 6A to 6F are views illustrating the internal state of the silicon substrate 1 in the etching operation in the first embodiment. First, {111} surfaces 21*a*, 21*b*, 21*c*, and 21*d*, which are one of the surface orientations of silicon, are formed so as to decrease in width in a direction from the opposite surface toward the surface of the silicon substrate 1. The dotted areas indicate the original position of the groove 7. During this time, the etching mask layer 4 is etched in a direction perpendicular to the thickness direction of the silicon substrate 1 (see FIG. 6A).

Figures 6A, 6B, 6C, 6D, 6E, 6F:
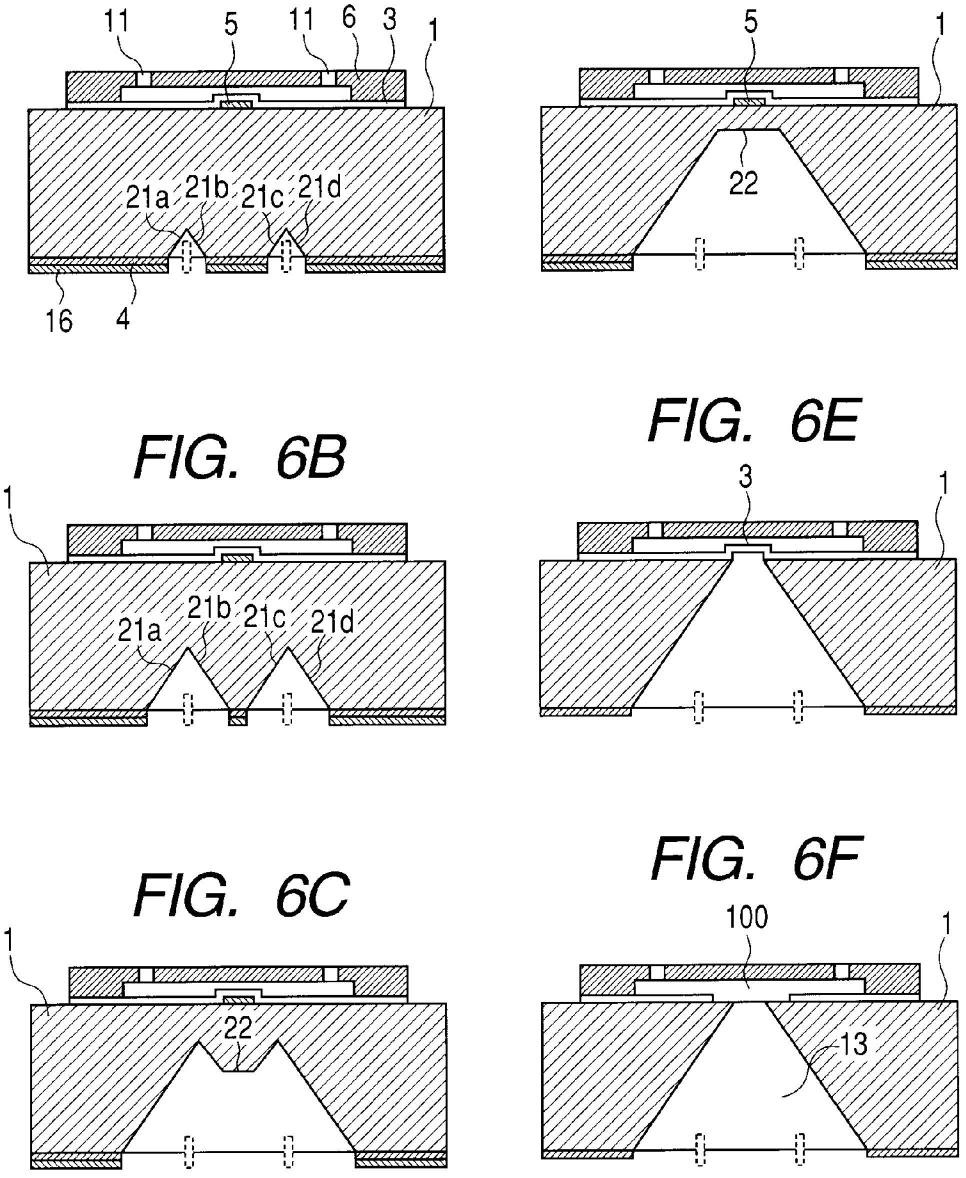
FIGS. 6A, 6B, 6C, 6D, 6E and 6F are views for describing a state during the manufacturing process in the manufacturing method of the ink jet recording head according to the first embodiment.

When etching further proceeds from the state illustrated in FIG. 6A, the {111} surfaces 21*a* and 21*b* intersect with each other at their tops and the {111} surfaces 21*c* and 21*d* intersect with each other at their tops, and it appears etching no longer proceeds in the thickness direction of the silicon substrate 1. However, since etching proceeds in the etching mask layer 4 in the direction perpendicular to the thickness direction of the silicon substrate 1, crystal anisotropic etching newly proceeds from the etched portions. In accordance with this, etching proceeds in the thickness direction of the silicon substrate 1 and in the direction perpendicular to the thickness direction (see FIG. 6B). When etching further proceeds from the state illustrated in FIG. 6B, the etching mask layer 4 remaining between the groove 7 is etched, and a {100} surface 22 is formed between the groove 7 (see FIG. 6C). When etching further proceeds from the state illustrated in FIG. 6C, the {100} surface 22 moves toward the surface of the silicon substrate 1 (see FIG. 6D), and eventually reaches the sacrificial layer 5. In this embodiment, the ink supply port 13 is formed in an etching time of 1450 minutes. By controlling a thickness of the protective film 16 of polysilazane and its etching rate to TMAH, a time for entirely removing the protective film 16 of polysilazane by TMAH can be matched to the etching time for the silicon substrate 1. Thus, a state where the protective film 16 is removed at a point when the through opening is formed in the silicon substrate 1 can be attained (FIG. 6E). The sacrificial layer 5 is removed, thereby completing the etching operation. Even in the case where a pinhole is present in the etching mask layer 4, the effect of the pinhole is insignificant if the etching time is short. Therefore, etching can be continued even after the protective film 16 of polysilazane is removed. Here, the protective film 16 of polysilazane is not necessarily required to be removed. Whether or not to remove the protective film 16 can be selected in consideration of, for example, compatibility between the protective film 16 and an adhesive that is applied to the opposite surface side of the silicon substrate 1 when bonding the opposite surface side to a support member of alumina or the like for supporting the silicon substrate 1, upon assembly of the ink jet recording head.

Lastly, a portion of the insulating protective film 3 that covers the opening of the ink supply port 13 is removed by dry etching, as illustrated in FIG. 6F. Thus, an ink flow path 100 communicated with the supply port 13 is formed.

As a result of the above-mentioned operations, the silicon substrate 1 (ink jet recording head substrate) where a nozzle portion for discharging, from the ink discharge ports 11, ink flowing from the ink supply port 13 is formed is completed. This silicon substrate 1 is cut and separated into chips by a dicing saw or the like. After electrical wiring for driving the energy generating elements 2 is performed on each chip, a chip tank member for ink supply is connected. This completes the ink jet recording head 10.

According to this embodiment, by forming the groove 7 with a laser, a time reduction of 240 minutes per lot (or batch) can be achieved when compared with a conventional method of performing a patterning operation of the etching mask layer 4 by a photolithography process.

Second Embodiment

Figure 7A:
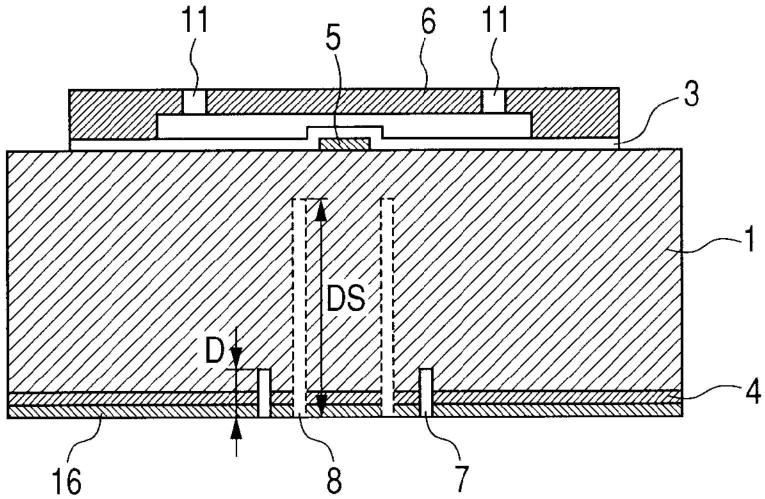
FIGS. 7A and 7B are views illustrating a state during a manufacturing process in a manufacturing method of an ink jet recording head according to a second embodiment.
Figure 7B:
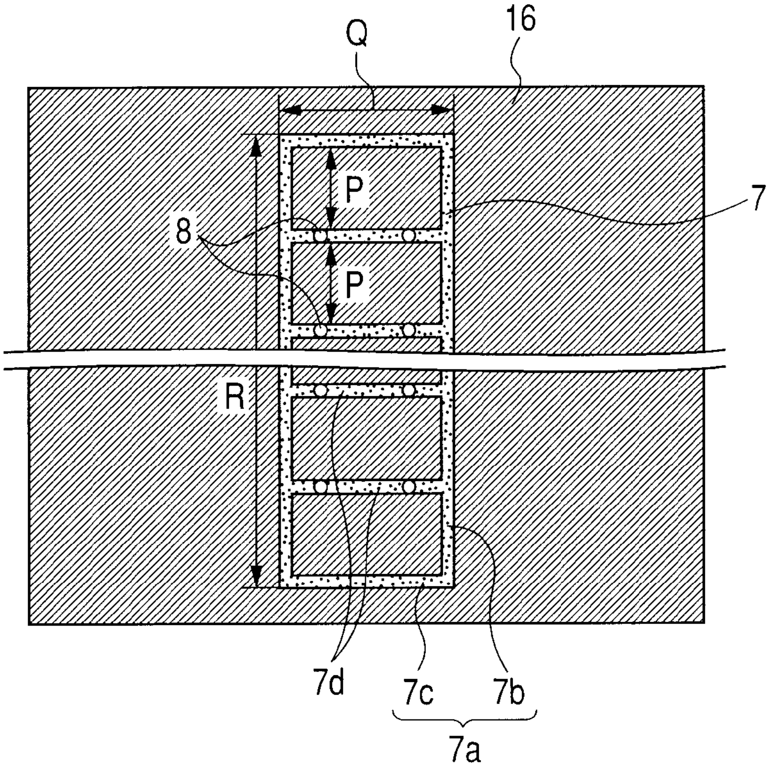

FIGS. 7A and 7B are views for describing a manufacturing method of an ink jet recording head in this embodiment. FIG. 7A is a sectional view of an ink jet recording head 12 in this embodiment, taken along a section line corresponding to the section line 2A-2A in FIG. 1. FIG. 7B is a plan view of the opposite surface of the silicon substrate 1 in the ink jet recording head 12. Note that the same structures as the ink jet recording head 10 described in the first embodiment are given the same numerals and their detailed description is omitted. Moreover, the ink jet recording head 12 is the same as the ink jet recording head 10 in the surface structure of the silicon substrate 1 and the above-mentioned layering process, and so their description is omitted, too.

In the ink jet recording head 12, first the groove 7 is formed in a lattice shape in a laser processing operation. This is the same as the one described in the first embodiment. That is, in the groove 7, the opposing side portions 7*d* are situated inside the outermost frame portions 7*a*, thereby forming a lattice shape. Of the outermost frame portions 7*a*, the lateral portions 7*c* (whose length is denoted by Q) that are connected with the longitudinal portions 7*b* (whose length is denoted by R) extending in the longitudinal direction of the silicon substrate 1 are approximately parallel to the opposing side portions 7*d*, and the opposing side portions 7*d* are connected with the longitudinal portions 7*b* as with the lateral portions 7*c*.

Following this, leading holes 8 as deep depressions illustrated in FIG. 7A are formed within the area enclosed by the outermost frame portions 7*a* of the groove 7. The leading holes 8 are non-through holes that pass through the etching mask layer 4 and the protective film 16 but end inside the silicon substrate 1. In this embodiment, part of the opposing side portions 7*d* is the leading holes 8. Moreover, the leading holes 8 are arranged in two rows in the longitudinal direction of the silicon substrate 1, as illustrated in FIG. 7B. Note that the arrangement of the leading holes 8 and the number of leading holes 8 are not limited as long as the leading holes 8 are formed within the opening (the opening on the opposite surface side of the silicon substrate 1) of the ink supply port 13. However, when the leading holes 8 are arranged so as to overlap the groove 7 (so are formed in the groove) as illustrated, the etchant can easily enter the leading holes 8 in the etching operation, which contributes to faster anisotropic etching. In this case, part of the groove 7 where the leading holes 8 are provided is depressed toward the surface of the silicon substrate 1 more deeply than part of the groove 7 surrounding the leading holes 8. When the thickness of the silicon substrate 1 is about 700 μm to 750 μm, the depth D of the outermost frame portions of the groove 7 is 5 μm to 20 μm. The groove 7 is formed by irradiating one pulse or a plurality of pulses of laser to one portion (of the etching mask layer 4) on the opposite side of the substrate 1, and then irradiating the laser in a same manner to a position as a center, deviated by substantially half of the laser spot diameter from the center of the previous pulse or pulses. These processes are repeated so that holes having different center positions are continuously aligned to form the groove 7. A depth DS of the leading holes 8 is 350 μm to 650 μm and the laser pulses having the number greater than those during forming the groove 7 are shot onto one spot of the substarte 1 so that the leading holes 8 as the deep depressions are formed in the groove 7. In this embodiment, the groove 7 has portions overlapping with the leading holes 8 as illustrated in FIG. 7B, and is formed in a lattice shape at a pitch of 800 μm in the longitudinal direction of the silicon substrate 1. Here, the pitch is set to 800 μm in consideration of the etching rate and the laser processing time, as described in the first embodiment (see Table 1).

After the laser processing operation ends, an etching operation is performed as in the first embodiment. In the etching operation, TMAH is used as an etchant as in the first embodiment, and the ink supply port 13 is formed from the protective film 16 (when present) to the sacrificial layer 5. An internal state of the silicon substrate 1 in the etching operation in this embodiment is described below, with reference to FIGS. 8A to 8E. FIGS. 8A to 8E are views illustrating the internal state of the silicon substrate 1 in the etching operation in the second embodiment. First, {111} surfaces 31*a*, 31*b*, 31*c*, and 31*d* are formed so as to decrease in width in the direction from the opposite surface toward the surface of the silicon substrate 1. At the same time, etching proceeds from the leading holes 8 and the groove 7 in the direction perpendicular to the thickness direction of the silicon substrate 1. Furthermore, in the opening of the ink supply port 13 on the opposite surface side of the silicon substrate 1, {111} surfaces 32*a* and 32*b* are formed so as to increase in width in the direction from the opposite surface toward the surface of the silicon substrate 1 (see FIG. 8A).

Figure 8A:
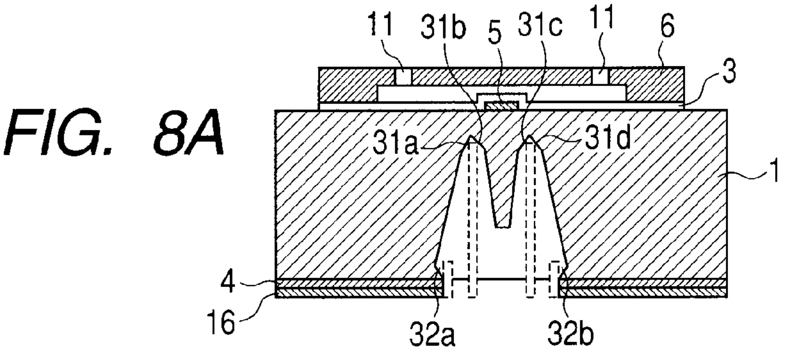
FIGS. 8A, 8B, 8C, 8D and 8E are views illustrating a state during the manufacturing process in the manufacturing method of the ink jet recording head according to the second embodiment.

When etching further proceeds from the state illustrated in FIG. 8A, the {111} surfaces 31*b* and 31*c* come into contact with each other, and etching proceeds from a top formed by this contact further in the direction toward the surface of the silicon substrate 1. In addition, the {111} surfaces 31*a* and 32*a* intersect with each other and the {111} surfaces 31*d* and 32*b* intersect with each other, and it appears that etching no longer proceeds in the direction perpendicular to the thickness direction of the silicon substrate 1 (see FIG. 8B).

Figure 8B:
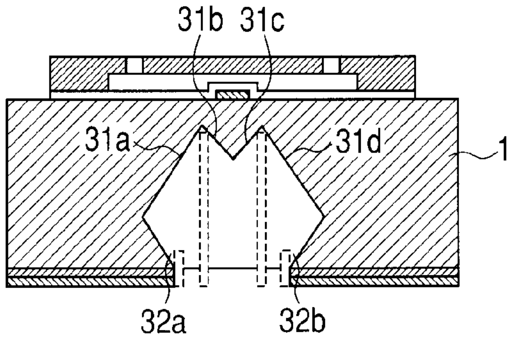
Figure 8C:
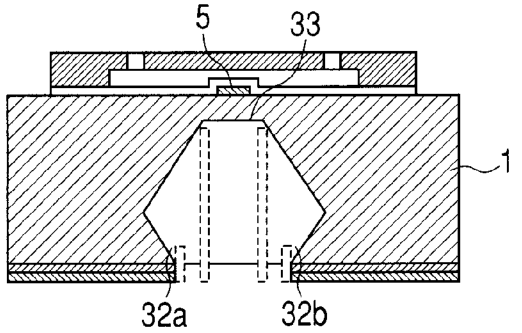
Figure 8D:
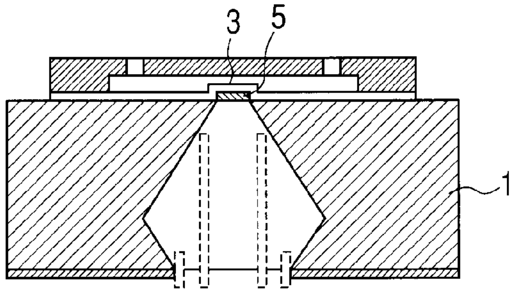

When etching further proceeds from the state illustrated in FIG. 8B, a {100} surface 33 is formed between the leading holes 8 arranged in two rows (see FIG. 8C). As etching proceeds, this {100} surface 33 moves toward the surface of the silicon substrate 1, and eventually reaches the sacrificial layer 5. After this, the sacrificial layer 5 is removed, thereby completing the etching operation (see FIG. 8D).

Figure 8E:
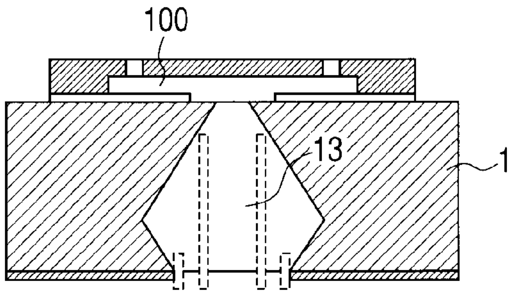

Lastly, a portion of the insulating protective film 3 that covers the opening of the ink supply port 13 on the surface side of the silicon substrate 1 is removed by dry etching, as illustrated in FIG. 8E. Thus, the ink flow path 100 is communicated with the supply port 13. Subsequently, the etching mask layer 4 may be removed.

As a result of the above-mentioned operations, the silicon substrate 1 (ink jet recording head substrate) where a nozzle portion is formed is completed. After this, the same processing as in the first embodiment is carried out to complete the ink jet recording head 12.

According to this embodiment, by forming the leading holes 8 by a laser together with the groove 7, a significant time reduction can be achieved when compared with a conventional method of performing a patterning operation of the etching mask layer 4 by a photolithography process.

The first and second embodiments describe the case where the groove 7 and the leading holes 8 are formed after the member serving as the ink flow path is formed on the surface of the silicon substrate 1 (so after organic film layer 6 has been formed on the silicon substrate). However, the present invention is not limited to this order, and the member serving as the ink flow path may be formed on the surface of the silicon substrate 1 after preparing the silicon substrate 1 where the groove 7, the leading holes 8, and the etching mask layer 4 are formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2009-044111, filed Feb. 26, 2009, No. 2009-285779, filed Dec. 16, 2009 which are hereby incorporated by reference herein in their entirety.

What is claimed is:

1. A manufacturing method of a liquid discharge head substrate that includes a silicon substrate having a first surface on which elements for generating energy used to discharge a liquid are provided and a supply port passing through the silicon substrate and being used for supplying the liquid to the elements, the manufacturing method comprising the steps of:

providing the silicon substrate having a second surface on which a layer having a lower etching rate, with respect to an etchant, than an etching rate of the silicon substrate, is formed, the second surface being opposite to the first surface;

forming a groove penetrating the layer and entering the substrate, the groove being in a frame shape enclosing a portion of the layer inside thereof when the silicon substrate is viewed from the second surface; and forming the supply port in the silicon substrate by wet etching the silicon substrate from the second surface in the frame shape enclosing the portion of the layer inside thereof toward the first surface through the groove using the etchant.

2. The manufacturing method as claimed in claim 1, wherein the groove is formed by irradiating the layer with a laser.

3. The manufacturing method as claimed in claim 1, wherein the layer is made of any of a silicon nitride and a silicon oxide.

4. The manufacturing method as claimed in claim 1, further comprising the step of:

forming the layer of a silicon oxide on the second surface by thermally oxidizing the silicon substrate to cause oxidization of a portion of the silicon substrate.

5. The manufacturing method as claimed in claim 1, wherein an aqueous solution of tetramethyl ammonium hydroxide is used as the etchant.

6. The manufacturing method as claimed in claim 1, wherein the groove includes a deep depression that is formed more deeply into the silicon substrate than surrounding portions of the groove.

7. The manufacturing method as claimed in claim 6, wherein the deep depression is situated inside an outermost frame of the groove that corresponds to one supply port.

8. The manufacturing method as claimed in claim 1, wherein the frame shape is formed by a solid line.

9. A manufacturing method of a liquid discharge head substrate that includes a silicon substrate having a first surface on which elements for generating energy used to discharge a liquid are provided and a supply port passing through the silicon substrate and being used for supplying the liquid to the elements, the manufacturing method comprising the steps of:

providing the silicon substrate having a second surface on which a layer having a lower etching rate, with respect to an etchant, than an etching rate of the silicon substrate, is formed, the second surface being opposite to the first surface;

forming a groove penetrating the layer and entering the substrate, the groove being in a lattice shape enclosing a portion of the layer inside thereof when the silicon substrate is viewed from the second surface; and forming the supply port in the silicon substrate by wet etching the silicon substrate from the second surface in the lattice shape enclosing the portion of the layer inside thereof toward the first surface through the groove using the etchant.

* * * * *